United States Patent
Chen (10) Patent No.: US 7,395,491 B2
(45) Date of Patent: Jul. 1, 2008

(54) DECODING DEVICE FOR DECODING PRODUCT CODE AND DECODING METHOD USING THE SAME

(75) Inventor: Jia-Ping Chen, Chiayi (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 357 days.

(21) Appl. No.: 10/908,239

(22) Filed: May 4, 2005

(65) Prior Publication Data

US 2006/0150054 A1    Jul. 6, 2006

(30) Foreign Application Priority Data

Jan. 3, 2005 (TW) .............................. 94100017 A (51) Int. Cl.
*H03M 13/00* (2006.01)
(52) U.S. Cl. ...................................... 714/780; 714/755
(58) Field of Classification Search ................ 714/780, 714/755
See application file for complete search history.

(56) References Cited

U.S. PATENT DOCUMENTS

| 4,336,612 A | * | 6/1982 | Inoue et al. ................. 714/755 |
| 5,712,861 A | * | 1/1998 | Inoue et al. ................. 714/752 |
| 6,108,811 A | * | 8/2000 | Nakamura et al. .......... 714/795 |
| 6,415,411 B1 | | 7/2002 | Nakamura ................... 714/755 |
| 6,446,236 B1 | * | 9/2002 | McEwen et al. ............ 714/795 |
| 6,877,128 B2 | * | 4/2005 | Boyer et al. ................. 714/771 |
| 2006/0008255 A1 | * | 1/2006 | Yen et al. .................... 386/124 |

* cited by examiner

*Primary Examiner*—Joseph D. Torres
(74) *Attorney, Agent, or Firm*—Jianq Chyun IP Office (57) ABSTRACT

A decoding device for decoding a product code and a decoding method using the same are provided. The decoding device comprises an erasure flag processor, a decoder and a confidence flag processor. The erasure flag processor determines to set a particular value or a non-particular value for each erasure flag according to a plurality of the confidence flags, wherein each symbol has a confidence flag and an erasure flag correspondingly and each confidence flag has a confidence flag value. The decoder is coupled to the erasure flag processor to correct the symbols according to the erasure flags and outputs the corrected symbols. The confidence flag processor is coupled to both the erasure flag processor and the decoder to reset the confidence flag values of the confidence flags according to the erasure flags and the corrected symbols.

7 Claims, 6 Drawing Sheets

DECODING DEVICE FOR DECODING PRODUCT CODE AND DECODING METHOD USING THE SAME

CROSS-REFERENCE TO RELATED APPLICATION

This application claims the priority benefit of Taiwan application serial no. 94100017, filed on Jan. 3, 2005. All disclosure of the Taiwan application is incorporated herein by reference.

BACKGROUND OF THE INVENTION

1. Field of the Invention

The present invention generally relates to a decoding device and a decoding method, and more particularly, to a decoding device for decoding a product code and a decoding method using the same.

2. Description of Related Art

Figure 1:
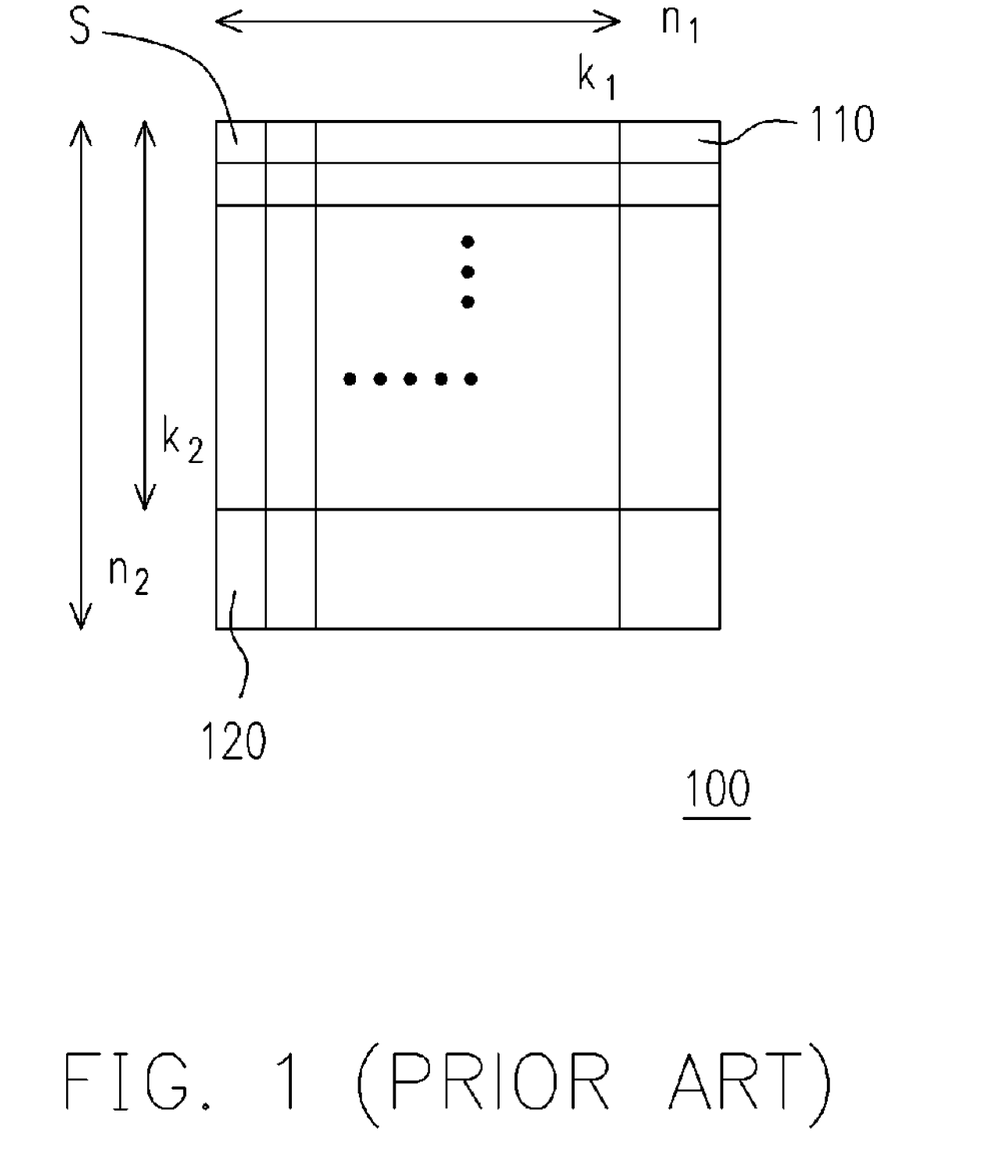
FIG. 1 schematically shows a conventional product code block.

In a playing or a recording system for digital video-audio signals, a product code application has become one of main encoding types. FIG. 1 schematically shows a conventional product code block 100. Referring to FIG. 1, the product code block 100 may be divided into a plurality of inner codes 110 with n1 length in a row direction and k1 dimension, and a plurality of outer codes 120 with n2 length in a column direction and k2 dimension. As a result, a decoder may first proceed with a decoding action in one direction in the product code block 100 to correct a portion of errors, and then proceed with the decoding action in another direction to correct the remaining portion of errors. Thus, by repeating this interleaving decoding procedure for several times, an error-correction rate of data can be raised by using the playing or a recording system for digital video-audio signals that exploit the product code 1.

In a conventional product code decoding method, when uncorrectable rows or columns are found after decoding in a certain direction is completed, the uncorrectable rows or columns are flagged an erasure by using an erasure flag. Besides, the rest of rows or columns are flagged an accuracy and these accuracy-flagged or erasure-flagged symbols are inputted to the decoder for proceeding with decoding in a row (column). However, if data to be decoded contain too many error symbols, mis-correction inevitably occurs. Meanwhile, the decoder not only fails to correct the inherent error symbols but executes an error-correction for the inherent accurate symbols. Because the inherent accurate symbols become the incorrect symbols, more incorrect symbols are generated.

Figure 2:
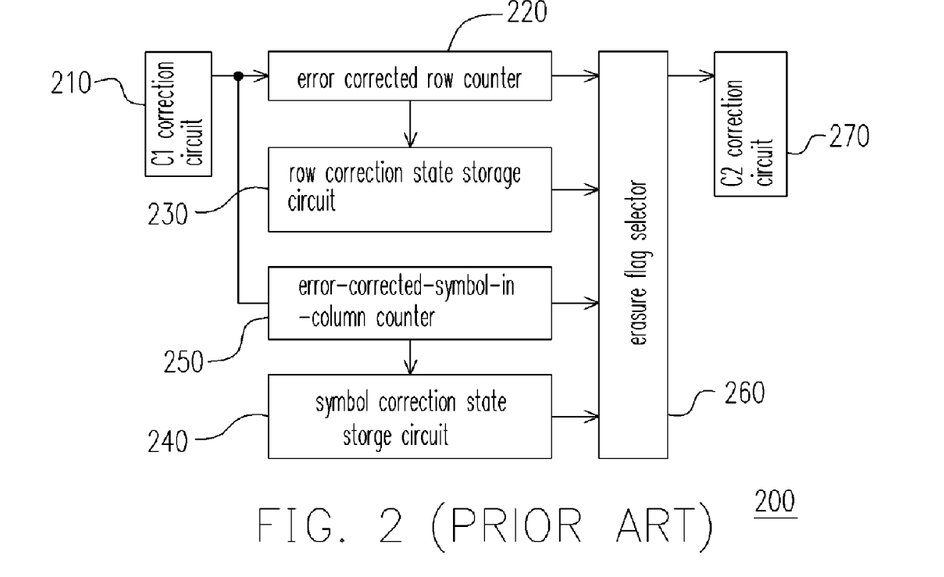
FIG. 2 schematically shows a configuration of a conventional product code decoder.

FIG. 2 schematically shows a configuration of a decoder for product code decoding. To solve the problems described above, the U.S. Pat. No. 6,415,411 B1 provides a method for counting the number of rows corrected by an inner code and error-corrected-symbol in column, and flagging erasure symbols by erasure flags, and a configuration for decoding a product code. Referring to FIGS. 1 and 2, a conventional decoding device 200 first inputs inner codes 110 in each row in the product code block 100 into a C1 correction circuit 210 to proceed with inner code decoding, and then counts the respective numbers of the uncorrectable rows and error corrected rows by using an error corrected row counter 220 and stores the states of the corrected rows in an row correction state storage circuit 230. Next, an error-corrected-symbol-in-column counter 250 counts the number of corrected symbols corrected by the inner code decoding in each column and the states of the error corrected symbols are stored in a symbol correction state storage circuit 240. Subsequently, an erasure flag selector 260 independently sets a plurality of erasure flags for the outer codes 120 in each column according to the error corrected row counter 220, the row error correction state storage circuit 230, the counted result outputted by the error-correcting-symbol-in-column counter 250 and stored in the symbol correction state storage circuit 240. Then, a C2 correction circuit 270 implements an error correction for the outer codes 120 in a column direction according to these erasure flags.

Figure 3:
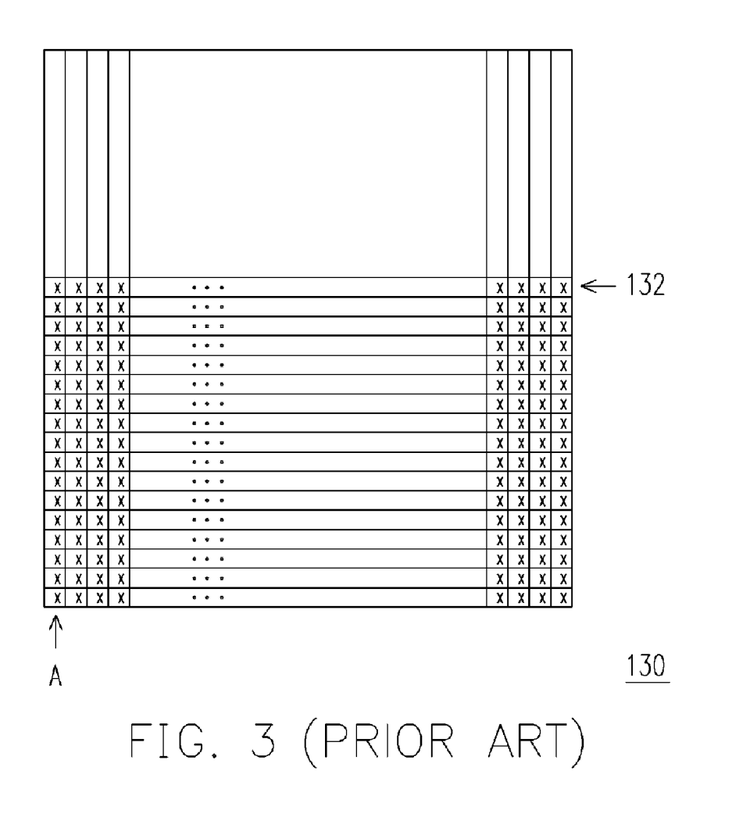
FIG. 3 schematically shows a DVD error-correcting code block applied by a conventional product code decoder.

FIG. 3 schematically shows a DVD error-correcting code block applied by a conventional product code decoder. Referring to FIGS. 2 and 3, for example, it is assumed that a decoding capability of the column decoder 270 is 16 symbols and the error-corrected row counter 220 counts 17 uncorrectable rows 132 in the error-correcting code block 130 in DVD after performing the inner code decoding procedure for one time. According to the decoding result, the erasure flags of the symbols intersected by a column A and one of the 17 uncorrectable rows 132 are set an erasure value (X) so that the column decoder 270 determines that the column A is uncorrectable and accordingly fails to proceed with an error correction for the column A.

Based on the above discussion, the most serious drawback of the conventional technology is that when the inner code decoding is completed, if the number of the uncorrectable rows in the error-correcting code block 130 is larger than an error-correcting capability of the outer code decoding, the all uncorrectable symbols in this column are set erasure flags. As a result, the outer code decoder completely fails to function, thus adversely affecting the performance of the decoding device.

SUMMARY OF THE INVENTION

Accordingly, the present invention is directed to a decoding device for decoding a product code and a decoding method using the same.

A decoding device for decoding product code, according to an embodiment of the present invention, comprises an erasure flag processor, a decoder and a confidence flag processor. The erasure flag processor determines to set a particular value or a non-particular value for each erasure flag, according to a plurality of the confidence flags, wherein each symbol has a confidence flag and an erasure flag correspondingly and each confidence flag has a confidence flag value. In addition, these confidence flag values belong to a confidence flag value group $\{C_0\ C_P\ C_{P-1}\ \ldots\ C_2\ C_1\}$, wherein the $C_0$ represents that its corresponding symbol has a highest confidence level of being a correct symbol, the $C_P$ represents that its corresponding symbol has a sub-highest confidence level of being a correct symbol, and so on. Therefore, the $C_1$ represents that its corresponding symbol has a lowest confidence level of being a correct symbol and p is an integer larger than 2. The decoder is coupled to the erasure flag processor to correct error symbols according to the erasure flags and outputs the corrected symbols. The confidence flag processor is coupled to both the erasure flag processor and the decoder to reset the confidence flag values of the confidence flags according to the erasure flags and the corrected symbols.

According to an embodiment of the present invention, the erasure flag processor sets erasure flags by using the relationship: $N_{cx}+N_{cx-1}+\ldots+N_{c1} \leq THR$. First, the x is substituted with p and then whether the above relationship is satisfied is determined, wherein if it is determined the said relationship is not satisfied, the confidence flag value is gradually reduced and the procedure of substituting x, and determining whether the relationship is satisfied or not is repeated until x=2 is obtained. During this process, if a confidence flag value of substituted x satisfies the above relationship, the erasure flag processor sets a particular value for erasure flags corresponding to the confidence flags with the confidence flag values $C_1 \sim C_x$. In addition, if the confidence flag value of substituted x, in which x value is from x=p to x=2, can not satisfy the above relationship, the erasure flags corresponding to the confidence flags with the confidence flag values $C_1$ are set with a particular value. Wherein $NC_x$ represents the number of the confidence flags with a confidence flag value $C_x$ and THR is a first predetermined value with an integer.

According to an embodiment of the present invention, the erasure flag processor comprises a confidence flag counter and an erasure flag generator. The confidence flag counter counts the number of the confidence flags with a same confidence value in symbols. The erasure flag generator is coupled to the confidence flag counter and respectively sets a particular value or a non-particular value for the erasure flags according to an output of the confidence flag counter.

According to an embodiment of the present invention, an algorithm of the confidence flag processor comprises determining whether the symbols are in an uncorrectable row (column), wherein if it is determined to be in an uncorrectable row (column), the erasure flag of each symbol is gradually checked to determine whether each symbol is set with a particular value. If yes, the confidence value of the symbol is reset $C_1$; if not, the confidence value of the symbol is reset $C_2$. If the symbols are in a correctable row (column), the algorithm flowchart proceeds to a next step. If the number of elements in the confidence flag value group is equal to 3, the non-reset confidence flag values of the confidence flags in the previous step are reset $C_0$; if not, the algorithm proceeds to a next step. Determining whether the symbols are in a row (column) with a number of error-corrected symbols exceeding a second predetermined value, if yes and if the symbols are corrected in the row (column), the confidence flag values of the confidence flags of the symbols are reset $C_x$ higher than $C_2$; if the symbols are non-corrected in the row (column), the confidence flag values of the confidence flags of the symbols are reset $C_j$ higher than $C_x$. The larger the number of the corrected symbols in the row (column), the lower the confidence level corresponding to the reset confidence flag values $C_x$ and $C_j$; if not, the confidence flag values corresponding to symbols are reset $C_0$, wherein the second predetermined value is an integer.

The present invention provides a decoding method for product code decoding comprising setting a particular value or a non-particular value for a plurality of erasure flags according to a plurality of confidence flags, wherein each symbol has a confidence flag and an erasure flag correspondingly and each confidence flag has a confidence flag value. In addition, these confidence flag values belong to a confidence flag value group $\{C_0\ C_P\ C_{P-1}\ \ldots\ C_2\ C_1\}$, wherein the $C_0$ represents that its corresponding symbol has a highest confidence level of being a correct symbol, the $C_P$ represents that its corresponding symbol has a sub-highest confidence level of being a correct symbol, and so on. Therefore, the $C_1$ represents that its corresponding symbol has a lowest confidence level of being a correct symbol and P is an integer greater than 2. Subsequently, the symbols are corrected according to the erasure flags. The confidence flag values of the confidence flags are then reset according to the erasure flags and the corrected symbols.

According to one embodiment of the present invention, the method for setting erasure flags utilizes the relationship: $N_{cx}+N_{cx-1}+\ldots+N_{c1} \leq THR$. First, x is substituted with P and then whether the relationship is satisfied or not is determined, if it is determined that the above relationship is not satisfied, the confidence flag value is gradually reduced and once again substitution of x, as well as determination of the relationship is repeated and this procedure is continued until x=2. During this process, if a confidence flag value of substituted x satisfies the relationship, the erasure flag processor sets a particular value for erasure flags corresponding to the confidence flags with the confidence flag values $C_1 \sim C_x$. In addition, if a confidence flag value of substituted x, in which x value is from x=P to x=2, can not satisfy the relationship, the erasure flags corresponding to the confidence flags with the confidence flag values $C_1$ are set with a particular value. Wherein $NC_x$ represents the number of the confidence flags with a confidence flag value $C_x$ and THR is a first predetermined value with an integer.

According to one embodiment of the present invention, in the procedure for resetting confidence flag values, first, whether symbols are in an uncorrectable row (column) is determined, if yes, the erasure flag of each symbol is gradually checked as to whether each symbol is set with a particular value; if yes, the confidence value of the symbol is reset $C_1$; if not, the confidence value of the symbol is reset $C_2$; if the symbols are in a correctable row (column), the algorithm proceeds to the next step; if the number of elements in the confidence flag value group is equal to 3, the non-reset confidence flag values of the confidence flags in the previous step are reset $C_0$; if not, the algorithm proceeds to the next step. Next, whether symbols are in a row (column) with the number of corrected symbols exceeding a second predetermined value is determined, if yes, the confidence flag values of the confidence flags of the corrected symbols are reset $C_x$ higher than $C_2$ and the confidence flag values of the confidence flags of the non-corrected symbols are reset $C_j$ higher than $C_x$; the larger the number of the corrected symbols in the row (column), the lower the confidence level corresponding to the reset confidence flag values $C_x$ and $C_j$; if not, the confidence flag values corresponding to symbols are reset $C_0$, wherein the second predetermined value is an integer.

According to an aspect of the present invention, a confidence flag is set with a confidence flag value for each symbol according to its possible levels of error. Next, erasure flag values corresponding to each symbol are set according to the number of confidence flags corresponding to each confidence flag value. Therefore, the present invention not only considers a mis-correction state in a tolerance range of error correction capability of error correction codes in a string symbols but also prevents the decoder form failing to function due to too many uncorrectable symbols.

The objectives, other features and advantages of the invention will become more apparent and easily understood from the following detailed description of the invention when taken in conjunction with the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to a decoding device for product code decoding and decoding method thereof, examples of which are illustrated in the accompanying drawings. Wherever possible, the same reference numbers are used in the drawings and the description to refer to the same or like parts.

The First Embodiment

The present invention provides a decoding method for decoding a product code. In this method, each symbol has a confidence flag and an erasure flag correspondingly and each confidence flag has a confidence flag value. In addition, these confidence flag values belong to a confidence flag value group $\{C_0 \ C_P \ C_{P-1} \ldots C_2 \ C_1\}$, wherein the $C_0$ represents that its corresponding symbol has a highest confidence level of being a correct symbol, the $C_P$ represents that its corresponding symbol has a sub-highest confidence level of being a correct symbol, and so on. Therefore, the $C_1$ represents that its corresponding symbol has a lowest confidence level of being a correct symbol and P is an integer greater than 2. It is noticeable that the confidence flag value group is used to define a high or low confidence level of its corresponding symbol so that the confidence flag value group has a plurality of expressions depending on practical needs.

In the decoding method for product code decoding, according to an embodiment of the present invention, first, a particular value or a non-particular value for a plurality of erasure flags are respectively set according to a plurality of confidence flags. Thereafter, symbols contained in a product code block are corrected according to these erasure flags. The confidence flag values of confidence flags are then reset according to these erasure flags and the corrected symbols. The decoding method and apparatus using the same will be described in detail hereinafter.

Figure 4:
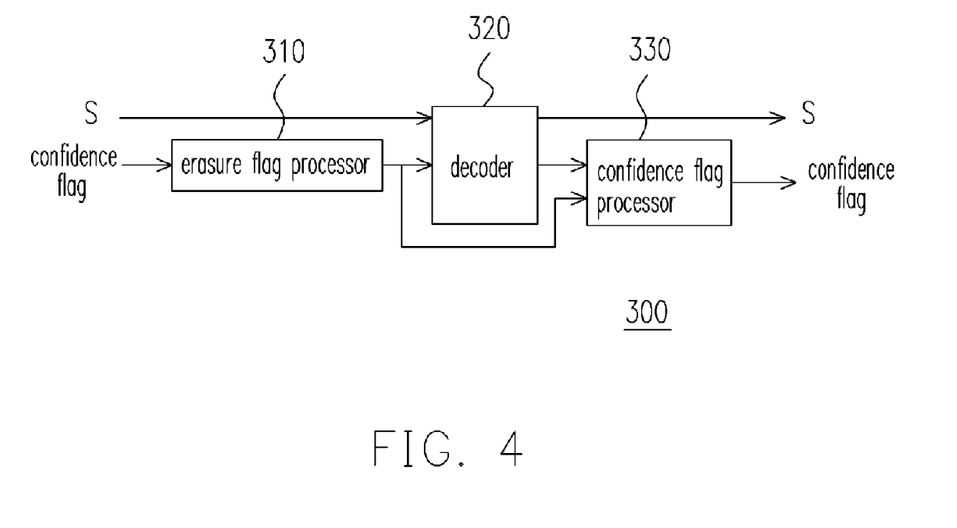
FIG. 4 schematically shows a decoding device for decoding a product code of an embodiment of the present invention.
Figure 5:
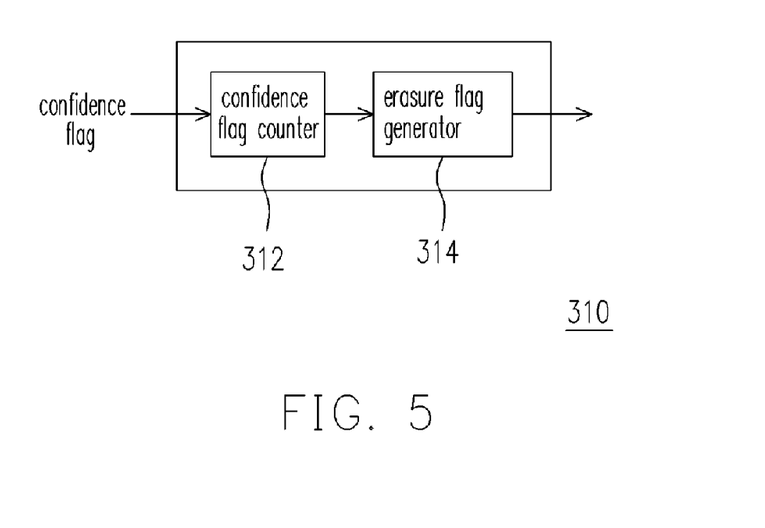
FIG. 5 schematically shows an erasure flag processor of an embodiment of the present invention.

FIG. 4 schematically shows a decoding device for decoding a product code according to an embodiment of the present invention. FIG. 5 schematically shows an erasure flag processor according to an embodiment of the present invention. As shown in FIG. 1, data stored in the product code block 100 can be regarded as a plurality of symbols S. These symbols S may be, for example, non-decoded raw data, or data outputted through a replication of product code decoding for several times. In addition, each symbol has a confidence flag and an erasure flag. Besides, each confidence flag has a confidence flag value. Referring to FIG. 1 and FIG. 4 concurrently, a decoding device 300 is adopted for using the decoding method for decoding the product code. According to an embodiment of the present invention, the decoding device comprises an erasure flag processor 310, a decoder 320 and a confidence flag processor 330. The erasure flag processor 310 reads a string symbols S from the product code block 100 and respectively sets a particular value or a non-particular value for a plurality of erasure flags according to confidence flags of these symbols, wherein the string symbols S, for example, comprise a plurality of data symbols $S_d$ and a plurality of error correction code symbols $S_{ec}$. The decoder 320 is coupled to the erasure flag processor 310 and corrects the symbols according to the erasure flags, as well as outputs the corrected symbols $S_c$. Moreover, the confidence flag processor 330 is coupled to both the erasure flag processor 310 and the decoder 320, and resets confidence flag values of confidence flags according to the erasure flags and the corrected symbols S. In addition, referring to FIG. 5, the erasure flag processor 310, for example, may further comprise a confidence flag counter 312 and an erasure flag generator 314. Wherein the confidence flag counter 312 counts the number of confidence flags with a same confidence flag value in symbols and the erasure flag generator 314 is coupled to the confidence flag counter 312 and sets one of a particular value and a non-particular value for the erasure flags according to an output of the confidence flag counter 312.

For the purpose of describing the present invention, a group, $\{0 \ P \ P-1 \ P-2 \ldots 2 \ 1\}$, is taken as a confidence flag value group, wherein 0 represents its corresponding symbol S having a highest confidence level of being a correct symbol S, P represents its corresponding symbol S having a sub-highest confidence level of being a correct symbol S, and so on. Hence, 1 represents that its corresponding symbol S has a lowest confidence level of being a correct symbol S and P is an integer greater than 2.

Figure 6:
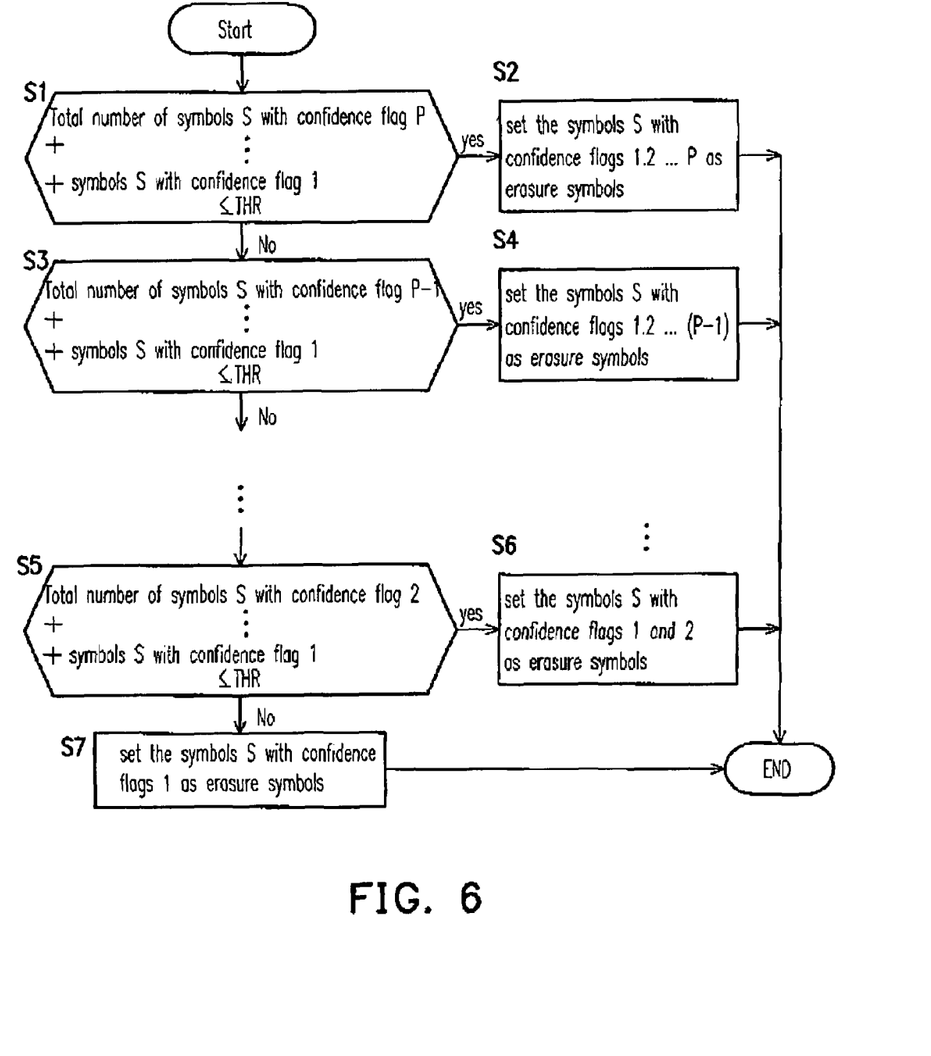
FIG. 6 is an algorithm flowchart of an erasure flag processor of an embodiment of the present invention.

FIG. 6 is an algorithm flowchart of an erasure flag processor of an embodiment of the present invention. Referring to FIG. 4 and FIG. 6 concurrently, when the erasure flag processor 310 receives a string symbols S, the erasure flag processor 310 respectively counts the number of these symbols S corresponding to confidence flag values from 1 to P, wherein if the received symbols S are non-decoded raw data, initial values of confidence flags may, for example, be set 0 or be provided by a front stage of decoding device 300 for decoding a product code. Subsequently, the erasure flag processor 310 sets a first predetermined value THR as a threshold value and checks whether the number of these symbols S corresponding to confidence flag values from 1 to P is smaller than or equal to the first predetermined value THR, i.e. the step S1 in FIG. 6. In addition, the first predetermined value THR is an integer. If this condition is satisfied, the erasure flag processor 310 flags erasure symbols for these symbols S corresponding to confidence flag values from 1 to P, i.e. the execution step S2 in FIG. 6. However, if the number of these symbols S corresponding to confidence flag values from 1 to P exceeds the first predetermined value THR, the algorithm flowchart proceeds to step S3, in which the erasure flag processor 310 checks whether the number of these symbols S corresponding to confidence flag values from 1 to (P-1) is smaller than or equal to the first predetermined value THR. Likewise, if this number is smaller than or equal to the first predetermined value THR, the step S4 is executed, and in the step S4, the symbols with confidence flag values from 1 to (P-1) are flagged erasure symbols before being inputted into the decoder 320. Similarly, when the step of checking the number of symbols with gradually reduced confidence flag values is repeated for (P-2) times and for each time when the number exceeds the first predetermined value THR (namely, the number of symbols with confidence flag values from 1 to 3 exceeds the first predetermined value THR), the step S5 is executed. In step S5, the erasure flag processor 310 checks whether the number of these symbols S with confidence flag values 1 and 2 is smaller than or equal to the first predetermined value THR. Likewise, if this number is smaller than or equal to the first predetermined value THR, the algorithm proceeds to step S6; namely, the symbols with confidence flag values 1 and 2 are flagged erasure symbols before being inputted into the decoder 320. Otherwise, the algorithm proceeds to step S7. Namely, only symbols with a confidence flag value 1 are flagged erasure symbols.

From the above description, the erasure flag processor 310 and an algorithm thereof utilize the relationship $N_{cx} + N_{cx-1} + \ldots + N_{c1} \leq THR$ to set erasure flags. First, x substituted is with p and then whether the relationship is satisfied is determined, if it is determined the above relationship is not satisfied, the confidence flag value is gradually reduced and once again substitution of x, as well as determination of whether the relationship is satisfied is repeated, and the procedure is continued until x=2. During this process, if a confidence flag value of substituted x satisfies the relationship, the erasure flag processor sets a particular value for erasure flags corresponding to the confidence flags with the confidence flag values $C_1 \sim C_x$. In addition, if the confidence flag value of substituted x, in which x value is from x=p to x=2, can not satisfy the relationship, the erasure flags corresponding to the confidence flags with the confidence flag values $C_1$ are set with a particular value. Wherein $NC_x$ represents the number of the confidence flags with a confidence flag value $C_x$ and THR is a first predetermined value with an integer.

After the erasure flags of the string symbols S inputted into the erasure flag processor 310 are flagged, these symbols S and their corresponding erasure flags are inputted into the decoder 320 to proceed with an error correction. If the decoder 320 finds the string symbols S are uncorrectable, the decoder 320 makes no change to the string symbols and directly outputs them. Otherwise, the decoder 320 finds error locations of error symbols S in the string symbols S and corrects error values on the error locations, as well as outputs the corrected result.

When the number of error symbols $S_{er}$ in the string symbols S exceeds decoding capability of the decoder 320, there is a possibility of mis-correction from occurring. Therefore, the larger the number of symbols S corrected by the decoder 320 in the string symbols S, the higher the possibility of mis-correction of symbols S. In the string symbols S, if a sum of two times the number of the error-corrected but not erasure flagged symbols and the number of the erasure-flagged symbols is larger than or equal to (d-M), the string symbols S should be regarded as state where there is high possibility of mis-correction. Subsequently, a confidence flag processor 330 resets confidence flag values for the string symbols S according to the number of symbols S corrected by the decoder 320 in the string symbols S. Relationship between the value M and the confidence flag values p can be expressed by, for example, the following equation: $M = \text{Max}_j (2i+1) \leq p$, wherein d is the minimum distance of the inner code or the outer code.

Figure 7:
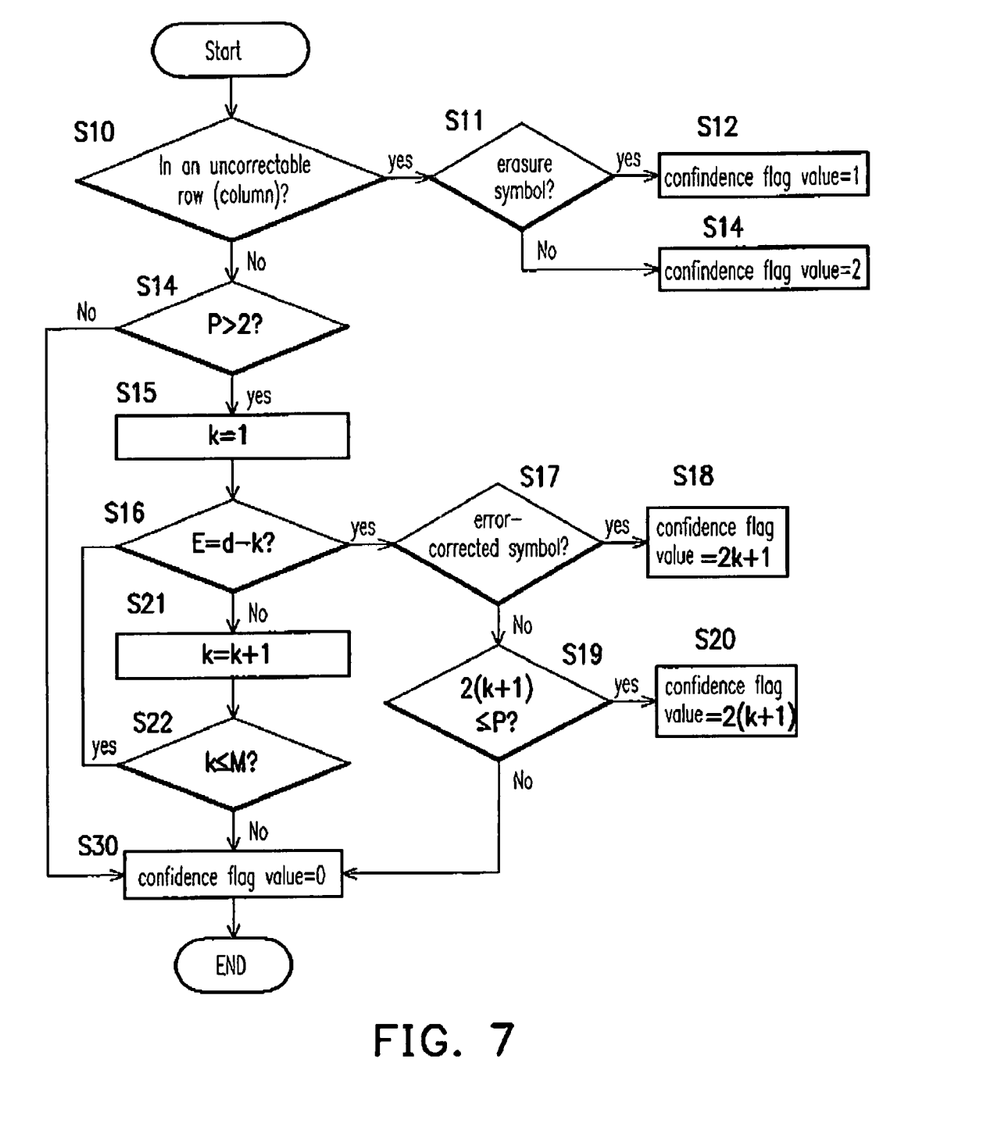
FIG. 7 is an algorithm flowchart of a confidence flag processor of an embodiment of the present invention.

FIG. 7 is an algorithm flowchart of a confidence flag processor of an embodiment of the present invention. Referring to FIG. 4 and FIG. 7 concurrently, the confidence flag processor 330 first determines whether the received string symbols S are in an uncorrectable row (column), i.e. step S10. If yes, the algorithm proceeds to step S11, in which whether the erasure flag of each symbols S is set with a particular value is determined. If yes, the symbol S has much low possibility of being a correct symbol. As a result, step S12 is executed to reset a lowest confidence flag state 1 for the symbol S. If not, step S13 is executed to reset a lower confidence flag state 2 for the symbol S. If not (i.e. if the received string symbols S are in a correctable row (column)), the confidence flag processor 330 determines whether to consider as a mis-correction case according to the sub-highest confidence flag value p of the confidence flags, as shown in the step S14. If P is smaller than or equal to 2, the mis-correction case is ruled out and all symbols' corresponding confidence flag values are set with a highest confidence state 0. In other words, the algorithm proceeds to step S30. If P exceeds 2, the confidence flag processor 330 considers the mis-correction state and executes the next step. It is assumed that a second predetermined value E is a sum of two times the number of the error-corrected but not erasure-flagged symbols $S_{ec}$ in the string symbols S inputted into the decoder 320 and the number of the symbols with their erasure flags being set with the particular value. Next, the confidence flag processor 330 determines whether possibility of mis-correction of the string symbol S occurrence is highest. At step S15, k=1 is assumed and at step S16, whether the second predetermined value E is equal to d-1 is determined. If yes, the confidence flag processor 330 executes step S17, in which whether the received string symbols S are corrected symbols S is determined. If yes, step S18 is executed, in which confidence values corresponding the symbols S are set 3; otherwise the confidence flag processor 330 executes step S19. A new confidence state is determined according to the confidence flag value p of the confidence flags. If $P \geq 4$, the new confidence state is set 4, i.e. step S20; otherwise, the symbol S is assigned the highest confidence state 0, i.e. step S30. At step 16, if it is determined that the second predetermined value E is not equal to d-1, the confidence flag processor 330 executes step S21 and step S22 to determine whether possibility of mis-correction of the string symbol S occurrence is sub-highest, and when the result is doubtful, steps S17 and S18, or S19 and S20 or S30 are repeated to update the confidence flag state. Otherwise, the algorithm executes step S30, which set 0 for confidence flag values of each symbol S in the string symbols S. After confidence flag values are being updated, the new confidence flag and the decoded symbol S are outputted as next-time decoding application of the decoder 320, or a direct output of the decoding device 300.

From the above description, a primary aspect of the confidence flag processor 330 and the algorithm thereof is that if the string symbols S are in an uncorrectable row (column), confidence flag values of the symbols S are set C1 or C2 according to their erasure flag values. When the erasure flags corresponding to the symbols S are set with particular values, the confidence flags are assigned with the lowest confidence value $C_1$. However, when the erasure flags corresponding to the symbols S are set non-particular values, the confidence flags are assigned with the lower confidence value $C_2$. Moreover, if the number of elements in the confidence flag value group is equal to 3, all non-reset symbols S are reset as $C_0$ with a highest confidence level. If the number of elements in the confidence flag value group exceeds 3, determining whether the symbols are in a row (column) with a number of error-corrected symbols by the decoder 320 exceeding a second predetermined value, if yes and if the symbols are corrected in the row (column), the confidence flag values of the confidence flags of the symbols are reset $C_x$ higher than $C_2$; if the symbols are non-corrected in the row (column), the confidence flag values of the confidence flags of the symbols are reset $C_j$ higher than $C_x$. In other words, the more the number of the corrected symbols, the lower the confidence levels of their confidence flag values $C_x$ and $C_j$. As mentioned above, if the number of the symbols S corrected by the decoder 320 in the string symbols S doesn't exceed the second predetermined value, the confidence flag values of the symbols S are reset $C_0$, wherein the second predetermined value is an integer.

The Second Embodiment

Figure 8A:
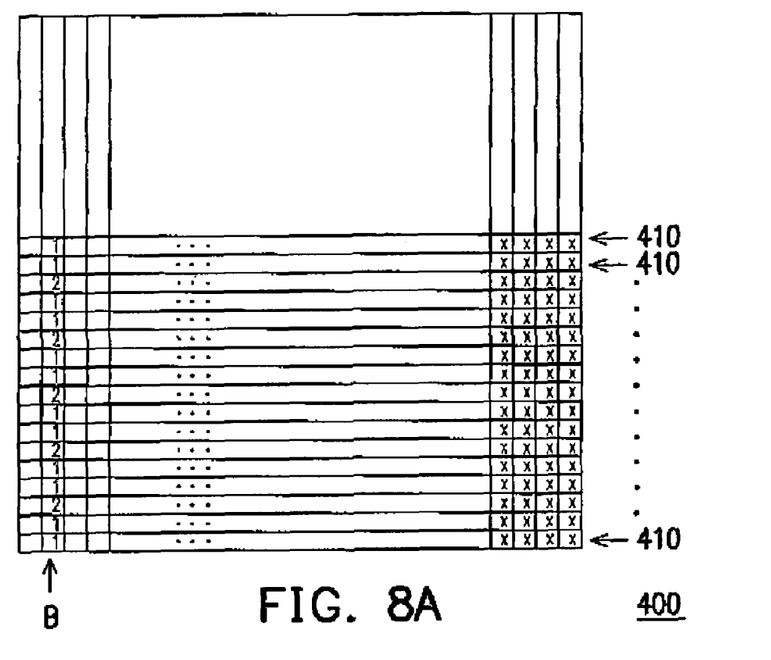
FIG. 8A and FIG. 8B schematically show a DVD error-correcting code block applied by a decoding method for decoding product code of another embodiment of the present invention.
Figure 8B:
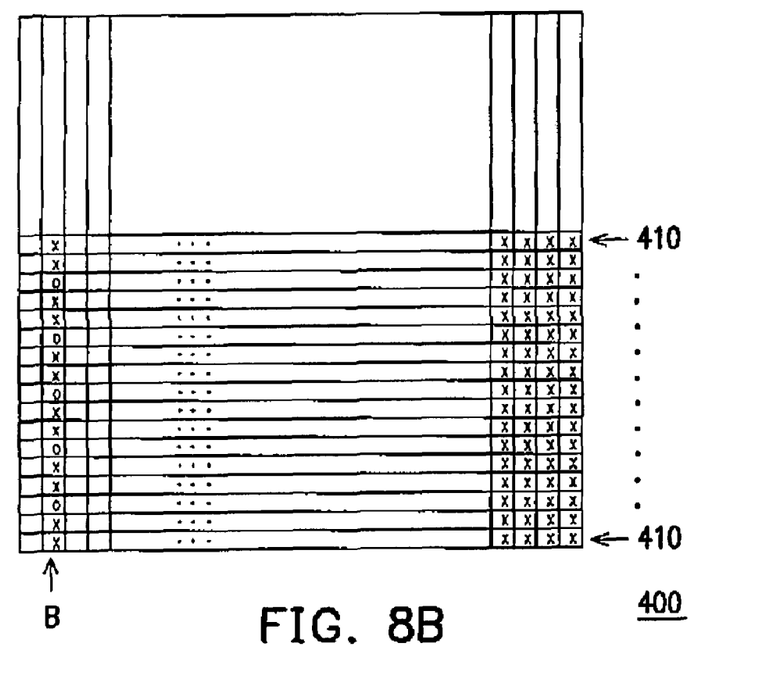

FIG. 8A and FIG. 8B schematically show a DVD error-correcting code block applied by a decoding method for product code of another embodiment of the present invention. Referring to FIG. 4, FIG. 8A and FIG. 8B, a decoding method for decoding product code and a decoding device using the same of the present invention may be exploited in the DVD error-correcting code block 400. It is assumed that a decoding capability of the decoder 320 is 16 symbols and the decoder 320 finds 17 uncorrectable rows 410 in the error-correcting code block 400 after the decoding of inner codes is completed for one time. Then, according to this decoding result, the confidence flag processor 330 may, for example, set confidence flag values for confidence flags corresponding to each symbol in error-correcting code block 400, wherein the confidence flag values may be, for example, 1 and 2 (as shown in FIG. 8A), followed by proceeding with decoding of outer code. The confidence flag value 1 of the symbols in the column B represents inherent erasure flag values of the symbols at this location are set with a particular value prior to decoding the symbols, while the confidence flag value 2 of the symbols in the column B represents inherent erasure flag values of the symbols at this location are set a non-particular value prior to decoding the symbols. If the number of the confidence flag value 1 of the symbols in the column B is less than 17 and the sum of the number of the symbols with the confidence flag value 1 and the number of the symbols with the confidence flag value 2 exceeds the decoding capability with 16 symbols of the decoder 320, according to the decoding method for produce code decoding of the first embodiment, the erasure flag processor only sets a particular value (X) for erasure flag values of the symbols with the confidence flag value 1 in the column B, sets a non-particular value (O) for erasure flag values of the rest of symbols in the column B. Therefore, the decoder 320 can proceed with an error correction action for the column B and the possibility of error correction in the column B is thereby raised. As a result, in each interleaved decoding procedure, the number of correctable rows or columns is increased and mis-correction rate is thus promoted. However in the prior art, the symbols intersected by the column B and the 17 uncorrectable rows 410 described above are all set with the non-particular value so that the decoder 320 determines the column B is uncorrectable and fails to proceed with any error correction action for the column B.

In conclusion, the decoding device for product code and decoding method thereof of the present invention sets confidence flags with confidence flag values for each symbol according to possibility levels of error occurrence in each symbol. Then, erasure flags of each symbol are set according to the number of the confidence flag corresponding to each confidence flag value. Therefore, the present invention not only considers a mis-correction state in a tolerance range of error correction capability of error correction codes in a series of symbols but prevents the decoder form failing to function due to too many uncorrectable symbols.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding device for decoding a product code, comprising:

an erasure flag processor, for setting a particular value or a non-particular value for a plurality of erasure flags according to a plurality of confidence flags, wherein each symbol has a confidence flag and an erasure flag correspondingly and each confidence flag has a confidence flag value belonging to a confidence flag value group {C0 CP CP-1 . . . C2 C1}, in which the C0 represents that its corresponding symbol has a highest confidence level of being a correct symbol, the CP represents that its corresponding symbol has a sub-highest confidence level of being a correct symbol, and so on, as well as the C1 represents that its corresponding symbol has a lowest confidence level of being a correct symbol and P is an integer greater than 2;

a decoder, coupled to the erasure flag processor, for correcting the symbols according to the erasure flags and outputting the corrected symbols; and a confidence flag processor, coupled to both the erasure flag processor and the decoder, for resetting the confidence flag values of the confidence flags according to the erasure flags and the corrected symbols;

wherein the confidence flag value assigned to the confidence flag corresponding to the erasure flags set with the particular value represents a lower confidence level lower than a confidence level represented by the confidence flag value assigned to the confidence flag corresponding to the erasure flags set with the non-particular value, when the number of the symbols having the erasure flag set with the particular value is less than the decoding capability of the decoder, the symbols are corrected by the decoder.

2. The decoding device for decoding a product code according to claim 1, wherein the erasure flag processor sets the erasure flags by utilizing a relationship: Ncx+Ncx-1+ . . . +Nc1≦THR, wherein x is first substituted with P and if the relationship is not satisfied, then the confidence flag value of substituted x is gradually reduced by one whether the relationship is satisfied or not until x=2, and wherein if the relationship is satisfied, the erasure flag processor sets a particular value for the erasure flags corresponding to the confidence flags with the confidence flag values C1~Cx; and if the confidence flag value of substituted x in which x value is from x=P to x=2 can not satisfy the relationship, the erasure flags corresponding to the confidence flags with the confidence flag values C1 are set with a particular value, and wherein NCx represents the number of the confidence flags with a confidence flag value Cx and THR is a first predetermined integer value.

3. The decoding device for decoding a product code according to claim 1, wherein the erasure flag processor comprises:

a confidence flag counter, for counting the number of the confidence flags with a same confidence value in the symbols;

an erasure flag generator, coupled to the confidence flag counter, for setting a particular value or a non-particular value for the erasure flags according to an output of the confidence flag counter.

4. The decoding device for decoding a product code according to claim 1, wherein an algorithm of the confidence flag processor comprises:

gradually checking the erasure flag of each symbol to determine whether each symbol is set with the particular value when the symbols are in an uncorrectable row (column), if each symbol is set with the particular value when the symbols are in an uncorrectable row (column), the confidence value of the symbol is reset C1 if each symbol is not set with the particular value when the symbols are in an uncorrectable row (column), the confidence value of the symbol is reset C2;

judging if the number of elements in the confidence flag value group is equal to 3 when the symbol is in a correctable row (column), if the number of elements in the confidence flag value group is equal to 3, the non-reset confidence flag values of the confidence flags in the previous step will be reset C0; and determining whether the symbols are in a row (column) with a number of error-corrected symbols exceeding a second predetermined value when the number of elements in the confidence flag value group is larger than 3;

if the symbols are in a row (column) with a number of error-corrected symbols exceeds a second predetermined value and if the symbols are corrected in the row (column), the confidence flag values of the confidence flags of the symbols are reset Ci which is higher than C2;

if the symbols are in a row (column) with a number of error-corrected symbols exceeds a second predetermined value and if the symbols are non-corrected in the row (column), the confidence flag values of the confidence flags of the symbols are reset Cj which is higher than Ci; and if the symbols are not in a row (column) with a number of error-corrected symbols exceeding a second predetermined value, the confidence flag values corresponding to symbols are reset C0; wherein the second predetermined value is an integer, and Ci and Cj are selected from the confidence flag value group.

5. A decoding method for decoding a product code, comprising:

setting a plurality of erasure flags with a particular value or a non-particular value according to a plurality of confidence flags, wherein each symbol has a confidence flag and an erasure flag correspondingly and each confidence flag has a confidence flag value belonging to a confidence flag value group $\{C0\ CP\ CP\text{-}1\ \ldots\ C2\ C1\}$, wherein the C0 represents that its corresponding symbol has a highest confidence level of being a correct symbol, the CP represents that its corresponding symbol has a sub-highest confidence level of being a correct symbol, and so on, as well as the C1 represents that its corresponding symbol has a lowest confidence level of being a correct symbol and P is an integer greater than 2;

correcting the symbols according to the erasure flags; and resetting confidence flag values of the confidence flags according to the erasure flags and the corrected symbols;

wherein the confidence flag value assigned to the confidence flag corresponding to the erasure flags set with the particular value represents a lower confidence level lower than a confidence level presented by the confidence flag value assigned to the confidence flag corresponding to the erasure flags set with the non-particular value, and when number of the symbols having the erasure flag set with the particular value is less than the decoding capability of the decoder, the symbols are corrected by the decoder.

6. The decoding method for decoding a product code according to claim 5, wherein the method for setting the erasure flags utilizes a relationship: $Ncx+Ncx\text{-}1+\ldots+Nc1 \leq THR$, wherein x is first substituted with P and if the relationship is not satisfied, then the confidence flag value of substituted x is gradually reduced by one whether the relationship is satisfied or not until x=2, and wherein if the relationship is satisfied, setting a particular value for erasure flags corresponding to the confidence flags with the confidence flag values $C1\sim Cx$; and if the confidence flag value of substituted x, in which x value is from x=P to x=2, can not satisfy the relationship, the erasure flags corresponding to the confidence flags with the confidence flag values C1 are set with a particular value, and wherein NCx represents the number of the confidence flags with a confidence flag value Cx and THR is a first predetermined integer value.

7. The decoding method for decoding a product code according to claim 5, wherein an algorithm in the method for resetting the confidence flag values comprises:

gradually checking the erasure flag of each symbol to determine whether each symbol is set with the particular value when the symbols are in an uncorrectable row (column), if each symbol is set with the particular value when the symbols are in an uncorrectable row, the confidence value of the symbol is reset C1; if each symbol is not set with the particular value when the symbols are in an uncorrectable row, the confidence value of the symbol is reset C2;

judging if the number of elements in the confidence flag value group is equal to 3 when the symbol is in a correctable row (column), the non-reset confidence flag values of the confidence flags in the previous step will be reset C0; otherwise determining whether the symbols are in a row (column) with a number of error-corrected symbols exceeding a second predetermined value when the number of elements in the confidence flag value group is larger than 3;

if the symbols are in a row (column) with a number of error-corrected symbols exceeding a second predetermined value and if the symbols are corrected in the row (column), the confidence flag values of the confidence flags of the symbols are reset Ci which is higher than C2, otherwise the symbols are non-corrected in the row (column), the confidence flag values of the confidence flags of the symbols are reset Cj which is higher than Ci; and if the symbols are not in a row (column) with a number of error-corrected symbols exceeding a second predetermined value the confidence flag values corresponding to symbols are reset C0, wherein the second predetermined value is an integer, and Ci and Cj are selected from the confidence flag value group.

* * * * *